(12) United States Patent
Ando

(10) Patent No.: US 8,736,727 B2
(45) Date of Patent: May 27, 2014

(54) SOLID-STATE IMAGING DEVICE AND METHOD FOR MANUFACTURING THE SAME, AND ELECTRONIC APPARATUS AND CAMERA MODULE

(75) Inventor: Atsuhiro Ando, Kanagawa (JP)

(73) Assignee: Sony Corporation, Tokyo (JP)

( * ) Notice: Subject to any disclaimer, the term of this patent is extended or adjusted under 35 U.S.C. 154(b) by 356 days.

(21) Appl. No.: 13/071,703

(22) Filed: Mar. 25, 2011

(65) Prior Publication Data

US 2011/0242376 A1 Oct. 6, 2011

(30) Foreign Application Priority Data

Apr. 2, 2010 (JP) .................................. 2010-086162

(51) Int. Cl.
*H04N 3/14* (2006.01)

(52) U.S. Cl.
USPC ........... 348/294; 348/273; 348/340; 257/435; 257/440; 438/70

(58) Field of Classification Search
USPC .......... 257/215, 219, 292, E31.073, 432–435, 257/440; 348/272, 294, 340, 374, 273; 438/64–75
See application file for complete search history.

(56) References Cited

U.S. PATENT DOCUMENTS

| 2008/0099867 A1 | 5/2008 | Sato |
| 2009/0136174 A1 | 5/2009 | Itahashi |
| 2009/0230494 A1 | 9/2009 | Takizawa |
| 2009/0251573 A1 | 10/2009 | Toyoda |

FOREIGN PATENT DOCUMENTS

| JP | 05-206425 | 8/1993 |
| JP | 2002-359363 | 12/2002 |
| JP | 2007-095792 | 4/2007 |
| JP | 2008-041847 | 2/2008 |
| JP | 2009252949 | 10/2009 |
| WO | 2007/037294 | 4/2007 |

OTHER PUBLICATIONS

European Search Report issued on May 7, 2012, in connection with counterpart EP Application No. 11 15 9882.

*Primary Examiner* — Paul Berardesca
(74) *Attorney, Agent, or Firm* — Dentons US LLP

(57) ABSTRACT

A solid-state imaging device includes a photoelectric conversion portion, a charge-receiving portion to which charges are transferred from the photoelectric conversion portion, and a light control film having a reverse tapered opening over the photoelectric conversion portion to reduce the intensity of diffracted light diffusing to regions other than the photoelectric conversion portion.

8 Claims, 13 Drawing Sheets

SOLID-STATE IMAGING DEVICE AND METHOD FOR MANUFACTURING THE SAME, AND ELECTRONIC APPARATUS AND CAMERA MODULE

BACKGROUND OF THE INVENTION

1. Field of the Invention

The present invention relates to a solid-state imaging device and a method for manufacturing the same, and to an electronic apparatus including the solid-state imaging device, such as a camera, and to a camera module.

2. Description of the Related Art

Solid-state imaging devices (image sensors) include CCD image sensors that include a charge-coupled device (CCD) for read-out signal charges, and CMOS image sensors in which each pixel includes one photoelectric conversion portion and a plurality of pixel transistors. These are used in a variety of portable terminal apparatuses, such as digital still cameras, digital video cameras, and cellular phones with a camera.

A CCD image sensor includes two-dimensionally arranged light-receiving portions acting as photoelectric conversion portions (photodiodes) that convert input light into signal charges and store the signal charges, and the stored signal charges are transferred through a vertical CCD register portion and a horizontal CCD register portion. In this type of solid-state imaging device, incoming light is reflected from the surface of the silicon substrate due to a difference in refractive index between the silicon oxide-based material of the gate insulating film, surface protective layer or planarizing layer and the silicon substrate. Consequently, the amount of light reaching the light-receiving portion is reduced and the sensitivity is reduced. Accordingly, the solid-state imaging device is provided with a silicon nitride antireflection layer over the light-receiving portion, and the multiple reflection effect is used to reduce the reflection of incoming light, thereby enhancing the sensitivity.

As the number of pixels in the solid-state imaging device is increased, the light-receiving area is reduced, and the opening width of the light-shielding film is reduced to a size less than or equal to the wavelength of light entering the photodiodes or the light-receiving portions. Consequently, incoming light is diffused to regions other than the light-receiving portion by diffraction. This can be a cause of the decrease in sensitivity and the occurrence of smears.

If the opening width of the light-shielding film is smaller than the wavelength of incoming light, the incoming light is diffused to regions other than the light-receiving portion by Fresnel diffraction. Consequently, charges generated in regions other than the light-receiving portion flow into the vertical CCD register portion to generate smears resulting in noises. Also, since the incoming light is diffused to regions other than the light-receiving portion, the sensitivity is reduced.

This phenomenon occurs not only in CCD image sensors, but also in CMOS image sensors, particularly, in a CMOS image sensor in which the charge storage portion is disposed at a side of the light-receiving portion so as to achieve a global shutter function. In CMOS image sensors having a global shutter function, the charge storage portion temporarily storing charges may be defined by a floating diffusion portion, or a memory portion disposed between the light-receiving portion and a floating diffusion portion. In these CMOS image sensors, if the opening width of the light-receiving portion is reduced to a size smaller than or equal to the wavelength of incoming light, the incoming light is diffused to regions other than the light-receiving portion, as described above, by diffraction. This can be a cause of the decrease in sensitivity and the occurrence of noise.

A CCD image sensor has been proposed in which the diffraction effect of incoming light is reduced by reversing the phase of incoming light at an open end of the light-receiving portion, in, for example, Japanese Unexamined Patent Application Publication Nos. 05-206425 and 2008-41847.

The structure for CMOS image sensors disclosed in, for example, Japanese Unexamined Patent Application Publication No. 2007-95792 is well known, in which a forward tapered shape of a waveguide structure near the silicon substrate is changed into a reverse tapered shape for total reflection of light entering the light-receiving portion of the silicon substrate through the lower end of the waveguide so that the light collection efficiency is enhanced. Japanese Unexamined Patent Application Publication No. 2009-252949 discloses a structure for CMOS image sensors in which copper wiring and overlying wider diffusion-preventing metal wiring are formed by a damascene process as wiring over the semiconductor substrate with a photoelectric conversion portion acting as the light-receiving portion.

SUMMARY OF THE INVENTION

In both Japanese Unexamined Patent Application Publication Nos. 05-206425 and 2008-41847, the optical path length of incoming light is varied by removing the antireflection layer covering the surface of the silicon substrate of the light-receiving portion only from the open end of the light-receiving portion. In order to achieve this structure, additional steps of forming a resist mask for patterning, and of wet etching or dry etching for removing the antireflection layer are performed. The increase in number of steps increases the manufacturing cost.

While the removal of the antireflection layer has been performed mainly by dry etching in recent years, accompanying the minimization of pixels in solid-state imaging devices for increasing the number of pixels, it has been widely known that plasma damage in a plasma process degrades the performance of the solid-state imaging device.

In Japanese Unexamined Patent Application Publication No. 2007-95792, a high refractive index region is formed at an upper portion of the silicon substrate so that light can be collected by reflection at the interface between the high refractive index region and an insulating layer. In this structure, the high refractive index region is formed into a shape reversely tapered toward the light-receiving portion for total internal reflection, thereby enhancing the sensitivity. However, since the high refractive index region in a reverse tapered shape has a height at which the tapered shape is changed, light entering through an on-chip lens is hardly prevented from being diffracted to enter the silicon substrate.

In the structure proposed in Japanese Unexamined Patent Application Publication No. 2009-252949, a metal wiring formed by a damascene process is disclosed. The copper wiring and overlying wider diffusion-preventing wiring form reverse tapered openings between their adjacent wiring portions. However, the distance between the reverse tapered shape formed by the wiring and the silicon substrate receiving light is increased by the presence of an insulating interlayer, and therefore the reverse tapered opening does not prevent diffracted light from entering the silicon substrate.

In a back-illuminated CMOS image sensor, on the other hand, undesired color mixing can be caused by diffusing diffracted light to adjacent pixels.

Accordingly, it is desirable to provide a solid-state imaging device that can reduce the intensity of light diffused to regions other than the photoelectric conversion portion by the diffraction effect of incoming light accompanying the miniaturization of pixels, and thus can enhance the sensitivity and reduce noises, such as smears and color mixing, and to provide a method for manufacturing the solid-state imaging device.

It is also desirable to provide an electronic apparatus including the solid-state imaging device, such as a camera, and to provide a camera module.

A solid-state imaging device according to an embodiment of the invention includes a photoelectric conversion portion, a charge-receiving portion to which charges are transferred from the photoelectric conversion portion, and a light control film having a reverse tapered opening over the photoelectric conversion portion to reduce the intensity of diffracted light diffusing to regions other than the photoelectric conversion portion.

Since the solid-state imaging device includes the light control film having a reverse tapered opening over the photoelectric conversion portion, the intensity of diffracted light diffusing to regions other than the photoelectric conversion portion can be reduced by the optical path difference between the light entering the opening and propagating in straight lines and the light diffracted at an edge of the opening and propagating along the reverse tapered face.

A method for manufacturing a solid-state imaging device according to an embodiment of the invention includes the step of forming a photoelectric conversion portion and a charge-receiving portion to which charges are transferred from the photoelectric conversion portion, in a semiconductor substrate. The method further includes the step of forming a light control film having a reverse tapered opening over the photoelectric conversion portion to reduce the intensity of diffracted light diffusing to regions other than the photoelectric conversion portion.

The method includes the step of forming the light control film having a reverse tapered opening over the photoelectric conversion portion. The light control film can reduce the intensity of diffracted light diffusing to regions other than the photoelectric conversion portion.

An electronic apparatus according to an embodiment of the invention includes a solid-state imaging device, an optical system that guides incoming light to a photoelectric conversion portion of the solid-state imaging device, and a signal processing circuit that processes a signal output from the solid-state imaging device. The solid-state imaging device includes a photoelectric conversion portion, a charge-receiving portion to which charges are transferred from the photoelectric conversion portion, and a light control film having a reverse tapered opening over the photoelectric conversion portion to reduce the intensity of diffracted light diffusing to regions other than the photoelectric conversion portion.

The solid-state imaging device of the electronic apparatus includes the light control film having a reverse tapered opening over the photoelectric conversion portion. The light control film reduces the intensity of diffracted light diffusing to regions other than the photoelectric conversion portion by the optical path difference between the light entering the opening and propagating in straight lines and the light diffracted at an edge of the opening and propagating along the reverse tapered face.

A camera module according to an embodiment of the invention includes a solid-state imaging device, an optical system that guides incoming light to a photoelectric conversion portion of the solid-state imaging device, and a signal processing circuit that processes a signal output from the solid-state imaging device. The solid-state imaging device includes a photoelectric conversion portion, a charge-receiving portion to which charges are transferred from the photoelectric conversion portion, and a light control film having a reverse tapered opening over the photoelectric conversion portion to reduce the intensity of diffracted light diffusing to regions other than the photoelectric conversion portion.

The solid-state imaging device of the camera module includes the light control film having a reverse tapered opening over the photoelectric conversion portion. The light control film reduces the intensity of diffracted light diffusing to regions other than the photoelectric conversion portion by the optical path difference between the light entering the opening and propagating in straight lines and the light diffracted at an edge of the opening and propagating along the reverse tapered face.

In the solid-state imaging device, the intensity of diffracted light diffusing to regions other than the photoelectric conversion portion can be reduced, and accordingly, the sensitivity is enhanced, and noises such as smears and color mixing can be reduced.

The method of manufacturing a solid-state imaging device of an embodiment of the invention can manufacture a solid-state imaging device whose sensitivity has been enhanced and in which noises such as smears and color mixing have been reduced.

In the electronic apparatus according an embodiment of the inventions, the sensitivity of the solid-state imaging device can be enhanced, and noises such as smears and color mixing can be reduced.

In the camera module according an embodiment of the inventions, the sensitivity of the solid-state imaging device can be enhanced, and noises such as smears and color mixing can be reduced.

DESCRIPTION OF THE PREFERRED EMBODIMENTS

Embodiments of the invention will now be described. The description will be made in the following order:

1. First Embodiment (structure and manufacturing method of solid-state imaging device)

2. Second Embodiment (Structure and manufacturing method of solid-state imaging device)

3. Third Embodiment (structure of solid-state imaging device)

4. Fourth Embodiment (structure of solid-state imaging device)

5. Fifth Embodiment (structure of solid-state imaging device)

6. Sixth Embodiment (structure of solid-state imaging device)

7. Seventh Embodiment (structure of electronic apparatus)

8. Eighth Embodiment (structure of camera module)

1. First Embodiment

Structure of Solid-State Imaging Device

The solid-state imaging device according to a first embodiment is a CCD image sensor. A CCD image sensor typically includes a plurality of photoelectric conversion portions acting as light-receiving portions, vertical transfer register portions having a CCD structure, arranged corresponding to each line of the photoelectric conversion portions, horizontal transfer register portions having a CCD structure, and an output portion.

Figure 1:
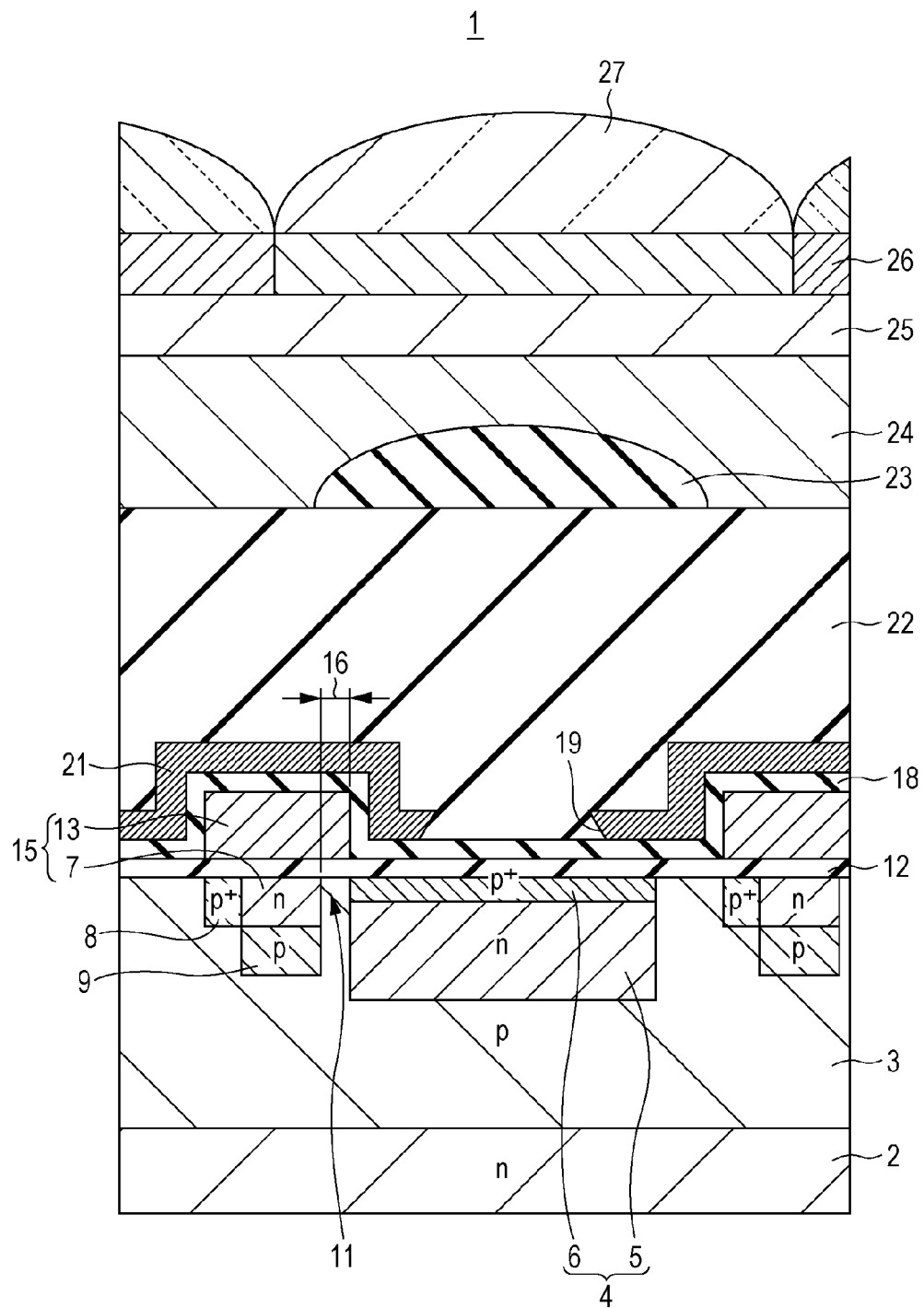
FIG. 1 is a schematic sectional view of a main portion of a solid-state imaging device according to a first embodiment of the invention.

FIG. 1 shows a solid-state imaging device according to the first embodiment of the invention, which is a CCD image sensor. FIG. 1 is a schematic sectional view showing one of a plurality of pixels arranged in a two-dimensional array (in a matrix manner) in an imaging region.

The solid-state imaging device 1 of the first embodiment includes second conductive semiconductor well regions 3 formed in a first conductive semiconductor substrate 2, and photoelectric conversion portions 4 acting as light-receiving portions in the respective semiconductor well regions 3. The photoelectric conversion portion 4 includes a first conductive semiconductor region 5 in which photoelectric conversion is performed and charges are stored, and a highly doped second conductive semiconductor region 6 reducing the dark current at the surface of the first conductive semiconductor region 5. The photoelectric conversion portion 4 is a so-called photodiode.

In the present embodiment, the first conductive type is the n type, and the second conductive type is the p type. Hence, a p-type semiconductor well region 3 is formed in an n-type semiconductor substrate 2, and the photoelectric conversion portion 4 is formed in the p-type semiconductor well region 3, in the present embodiment.

The p-type semiconductor well region 3 is also provided with an n-type embedded channel region 7 close to the photoelectric conversion portion 4 and a p-type channel stop region 8 surrounding the photoelectric conversion portion 4. The embedded channel region 7 receives charges from the photoelectric conversion portion 4, as will be described below, and transfers the charges in the vertical direction, thus functioning as a charge-receiving region. A second p-type semiconductor well region 9 is formed immediately under the embedded channel region 7. The region between the photoelectric conversion portion 4 and the embedded channel region 7 acts as a charge read-out region 11 that reads out the charge of the photoelectric conversion portion 4 to the embedded channel region 7. A vertical transfer gate electrode 13 is disposed so as to cover the read-out region 11, the embedded channel region 7 and the channel stop region 8 on the surface of the semiconductor substrate 2 with a gate insulating film 12 therebetween. A plurality of the vertical transfer gate electrodes 13 are arranged along the charge transfer direction.

The embedded channel region 7 and the vertical transfer gate electrodes 13 over the embedded channel region 7 define a vertical transfer register portion 15 having a CCD structure, and the read-out region 11 and a read-out gate electrode over the read-out region 11 define a read-out gate portion 16. The read-out gate electrode doubles as the vertical transfer gate electrode 13. A unit pixel includes one photoelectric conversion portion 4 and the corresponding vertical transfer register portion 15. A plurality of unit pixels are regularly arranged in a two-dimensional array (in a matrix manner) so as to define an imaging region.

In the present embodiment, a light-shielding film 21 acting as a light control film, having a reverse tapered opening 19 is formed on an insulating interlayer 18 formed over the entire surface to cover the vertical transfer gate electrodes 13. The insulating interlayer 18 also acts as an antireflection layer over the photoelectric conversion portion 4, and is made of, for example, silicon nitride. The light-shielding film 21 is formed in such a manner that the opening 19 is located corresponding to the photoelectric conversion portion 4; hence, the light-shielding film 21 is formed over the entire surface except the region overlying the photoelectric conversion portion 4. The light-shielding film 21 juts into the region overlying the photoelectric conversion portion 4, and accordingly, the lower end of the opening 19 has a smaller area than the photoelectric conversion portion 4.

An insulating interlayer 22 is formed over the entire surface of the light-shielding film 21 including the inside of the opening 19, and an in-layer lens 23 is formed on the insulating interlayer 22 in a region corresponding to the photoelectric conversion portion 4. The in-layer lens 23 is made of an insulating material having a different refractive index from the material of a surface protective layer 24 covering the in-layer lens 23. Furthermore, after forming a planarizing layer 25, a color filter 26 and an on-chip microlens 27 are provided.

In the solid-state imaging device 1 of the present embodiment, incoming light passes through the on-chip microlens 27, the color filter 26, the planarizing layer 25 and the surface protective layer 24. The light further passes through the in-layer lens 23 to be condensed and enters the photoelectric conversion portion 4 through the opening 19 of the light-shielding film 21. The light is converted in the photoelectric conversion portion 4 to electricity to generate charges or electrons used as signal charges, and these electrons are stored in the semiconductor region 5. When a read-out gate pulse is applied to the read-out gate electrode doubling as the vertical transfer gate electrode 13, the charges in the semiconductor region 5 is read out to the vertical transfer register portion 15. The charges in the vertical transfer register portion 15 is transferred in the vertical direction to a horizontal transfer register portion (not shown) having a CCD structure by a pulsed vertical driving voltage applied to the vertical transfer gate electrode 13. The charges in the horizontal transfer register are transferred in the horizontal direction by horizontal driving pulses, and the charges are converted to a voltage in an output portion and outputted as a pixel signal.

If light entering through the opening 19 of the light-shielding film 21 diffuses to regions other than the photoelectric conversion portion and enters the vertical transfer register portion to be converted to an electrical signal, this signal acts as noise relative to the charges stored in the semiconductor region 5. In other words, smear components produced from the light diffused to regions other than the photoelectric conversion portion act as noise. It is therefore important to prevent light from entering regions other than the photoelectric conversion portion, in terms of improving the characteristics of the CCD image sensor.

Figure 2:
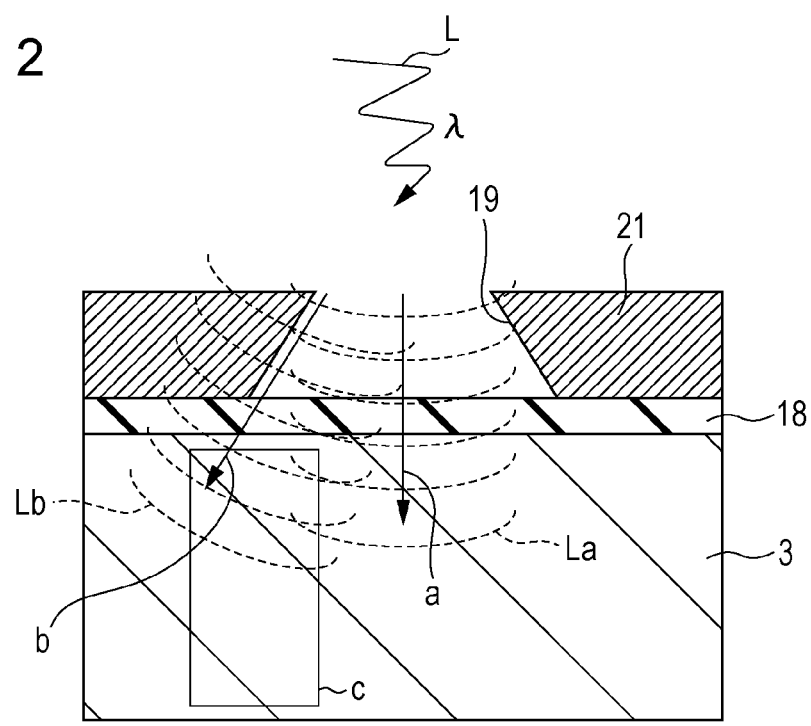
FIG. 2 is a sectional view showing a state of light entering an opening of a light-shielding film.

The first embodiment features the light-shielding film 21 having the reverse tapered opening 19. FIG. 2 shows a case in which light enters the opening 19 of the light-shielding film 21. As shown in FIG. 2, a difference (optical path difference) between the optical path a of light La propagating in straight lines in the opening 19 and an optical path b of diffracted light Lb along the tapered face of the opening 19 produces a phase difference in a region c including a region other than the photoelectric conversion portion. The intensity of the diffracted light Lb is reduced in this region c. Consequently, light entering the photoelectric conversion portion can be prevented from diffusing in the horizontal direction.

The reverse tapered shape of the opening 19 can be determined by using the following equation:

$$\tfrac{1}{2}\lambda(n-1) = \sqrt{d^2 + (y-x)/2)^2} - d$$

Figure 3:
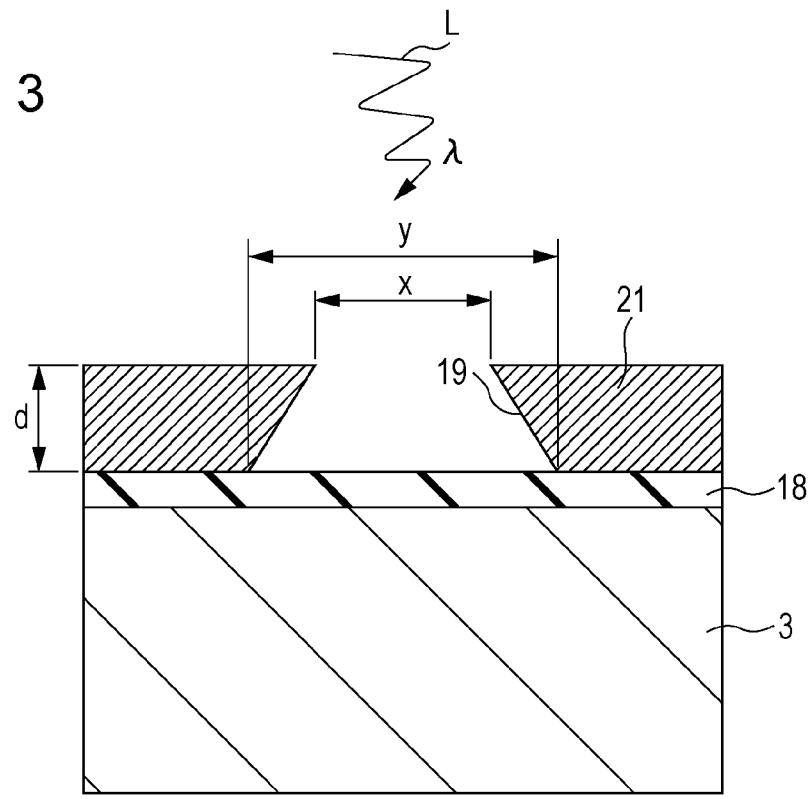
FIG. 3 is a representation of the equation for determining the shape of the reverse tapered opening.

This equation represents the conditions where light L having entered the reverse tapered opening 19 of the light-shielding film 21 shown in FIG. 3 is diffracted at the upper edge of the opening 19 (x face) and the phase of the light is reversed precisely at the lower edge (y faces). In FIG. 3, the thickness of the light-shielding film, or the height of the reverse tapered portion, is represented by d (nm); the upper diameter of the opening 19 is represented by x (nm); the lower diameter of the opening 19 is represented by y (nm); the refractive index of the material defining the opening 19, that is, the refractive index of the insulating interlayer 22, is represented by n; and the wavelength of incoming light L is represented by λ (nm).

The light-shielding film 21, which preferably has a sufficient shielding property against light used in the solid-state imaging device, is made of tungsten (W), aluminum (Al), tantalum (Ta), ruthenium (Ru) or the like.

The thickness of the light-shielding film 21 is set so that light diffracted through the opening 19 can propagate within the opening 19 as is. The thickness of the light-shielding film 21 also depends on the desired light-shielding property. For example, a tungsten (W) light-shielding film preferably has a thickness of about 100 to 300 nm. A thickness of less than 100 nm does not provide a sufficient light-shielding property. In contrast, a thickness of larger than 300 nm forms a large step height, and accordingly, layers overlying the light-shielding film 21 are not planarized.

When light having a wavelength of 550 nm enters the opening 19 of the light-shielding film 21 having a thickness d of 200 nm through the insulating interlayer 22 having a refractive index of 1.45, the reverse taper angle θ at which diffraction can be minimized is 48° from the above equation.

Since the incident angle distribution is varied depending on the shapes of the on-chip microlens 27 and the in-layer lens 23, the most suitable shape obtained from the above equation can produce an effective effect when the reverse taper angle θ of the shape has a tolerance within ±10° (θ>0°).

Preferably, the light-shielding film 21 has a multilayer structure including at least two layers having different etching properties in view of the process for forming the light-shielding film 21 as described below. In this instance, the light-shielding film 21 preferably has a reverse tapered section or a section having a plurality of steps corresponding to the layers of the light-shielding film 21 (multi-step shape). For a section having a multi-step shape, the reverse tapered angle θ obtained from the above equation is defined by the angle formed with the base of the opening 19 and the inclined line connecting the uppermost and lowermost edges of the opening 19 in the light-shielding film 21.

The reverse tapered shape of the opening 19 in the light-shielding film 21 is effective in reducing the intensity of diffracted light having long wavelengths. In the present embodiment, openings 19 having the same reverse tapered shape are formed for red, green and blue pixels, that is, openings 19 having a reverse tapered shape for wavelengths of red light. In this instance, the opening 19 can be formed according to wavelengths of red light by controlling the reverse taper angle θ without varying the thickness of the light-shielding film 21.

Figure 4A:
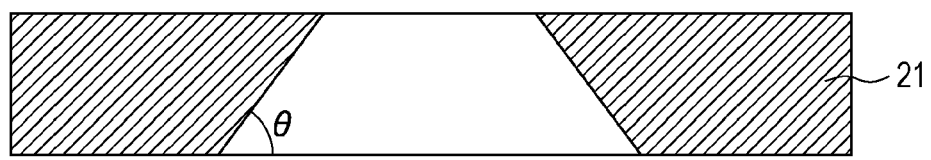
FIGS. 4A to 4C are schematic sectional views of exemplary structures of the reverse tapered opening.
Figure 4B:
Figure 4C:
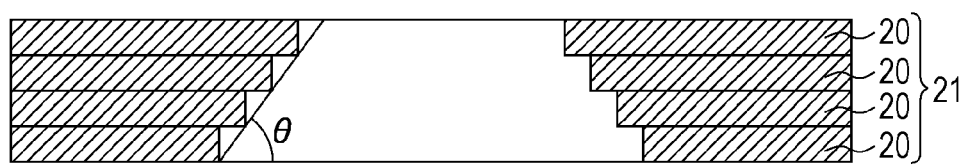

FIGS. 4A to 4C show examples of the section of the light-shielding film 21 having a reverse tapered opening. The opening shown in FIG. 4A has a trapezoidal section. The opening shown in FIG. 4B has a section having concave sides and a reverse taper angle θ between the base of the opening and the inclined line connecting the upper and lower edges of the opening. The opening shown in FIG. 4C is defined by a plurality of layers 20 and has a multi-step section having a reverse taper angle θ between the base of the opening and the inclined line connecting the upper and lower edges of the opening. The opening having the section shown in FIG. 4C can be formed as below. A plurality of layers having different etching properties are formed. More specifically, the layers are formed in decreasing order of etching rate, and then the layers are subjected to dry etching or wet etching so as to form an opening having steps whose diameter increases downward. For example, for a film including a W lower layer and an Al upper layer, a desired shape can be formed by etching the Al layer with chlorine gas, and subsequently etching the W layer with a fluorine-based gas.

In the CCD image sensor 1 of the first embodiment, the light-shielding film 21 has an opening 19 having a reverse tapered shape. The reverse tapered shape can ensure that incoming light propagates to the photoelectric conversion portion 4, and hence it can prevent diffracted light from diffusing to regions other than the photoelectric conversion portion 4. Accordingly, the sensitivity of the CCD image sensor can be enhanced. In addition, diffracted light is prevented from entering the vertical transfer register portion, and thus, smears can be reduced. The present embodiment produces a marked effect particularly in solid-state imaging devices including a large number of miniaturized pixels. Since such a solid state imaging device can reduce the intensity of diffracted light diffusing to regions other than the photoelectric conversion portion, the sensitivity can be enhanced and smears can be reduced.

Method for Manufacturing Solid-State Imaging Device

Figure 5A:
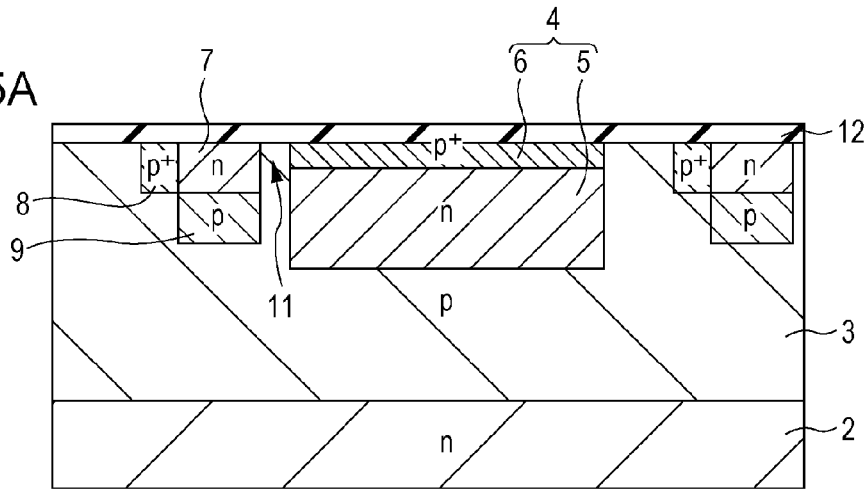
FIGS. 5A to 5C are representations of a manufacturing method of a solid-state imaging device according to a first embodiment of the present invention.

FIGS. 5A to 6D show an exemplary method for manufacturing the solid-state imaging device 1, or CCD image sensor, according to the first embodiment. First, as shown in FIG. 5A, a p-type semiconductor well region 3 is formed in an n-type silicon semiconductor substrate 2. The p-type semiconductor well region 3 is subjected to ion implantation of an n-type impurity and a p-type impurity to form a photoelectric conversion portion (photodiode) 4 including an n-type semiconductor region 5 and a p-type semiconductor region 6. The photoelectric conversion portion acts as a light-receiving portion. The p-type semiconductor well region 3 is provided therein with an n-type embedded channel region 7, a p-type channel stop region 8, and a second p-type semiconductor well region 9 immediately under the embedded channel region 7. A silicon oxide gate insulating film 12 is formed so as to have a thickness of about 50 nm over the surface of the semiconductor substrate 2 by thermal oxidation.

Figure 5B:
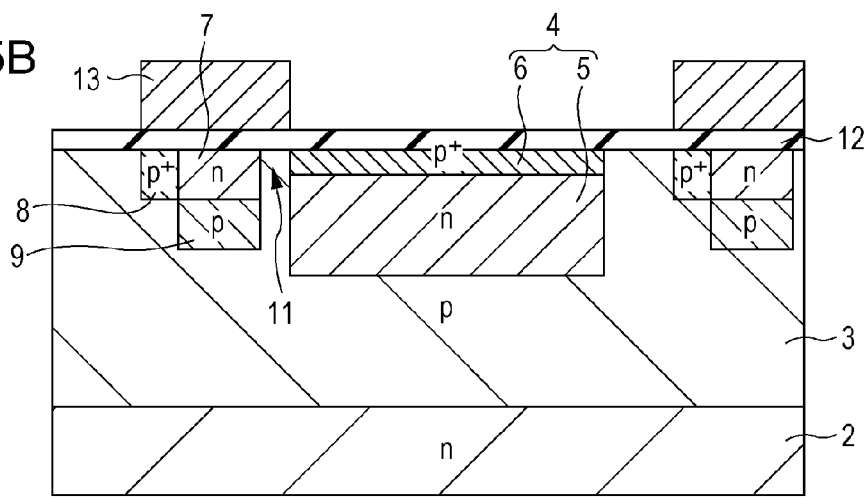

Subsequently, a polysilicon layer is formed on the gate insulating film 12 by chemical vapor deposition (CVD), and a tungsten silicide (WSi) layer is further formed by, for example, sputtering. The WSi layer and the polysilicon layer are selectively etched through a positive resist mask formed by lithography on the region where electrodes are to be formed, and thus a vertical transfer gate electrode 13 is formed as shown in FIG. 5B. The vertical transfer gate electrode 13, part of which acts as a read-out electrode, is disposed over the area including the read-out region 11, the embedded channel region 7 and the p-type channel stop region 8.

Figure 5C:
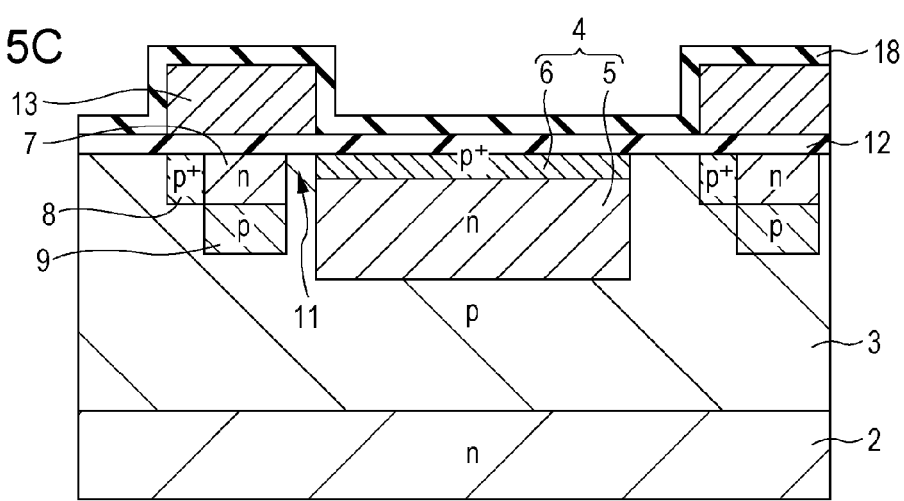

Subsequently, as shown in FIG. 5C, a silicon oxide layer (not shown) is formed over the entire surface to cover the vertical transfer gate electrodes 13 by thermal oxidation and CVD, and then an antireflection layer 18 is formed so as to cover the photoelectric conversion portion 4 by vacuum CVD. The antireflection layer 18 may be, for example, a silicon nitride (SiN) film or a silicon oxynitride (SiON) film. The antireflection layer 18 is formed over the entire surface covering the photoelectric conversion portion 4. Furthermore, a silicon oxide layer (not shown) is formed over the entire surface of the antireflection layer 18 by CVD. Then, the material of the light-shielding film, such as tungsten (W), is deposited by sputtering and further deposited continuously by CVD to form a material layer having a sufficient thickness to act as a light-shielding film over the entire surface. The tungsten layer formed by sputtering enhances the adhesion to the underlayer.

Figure 6D:
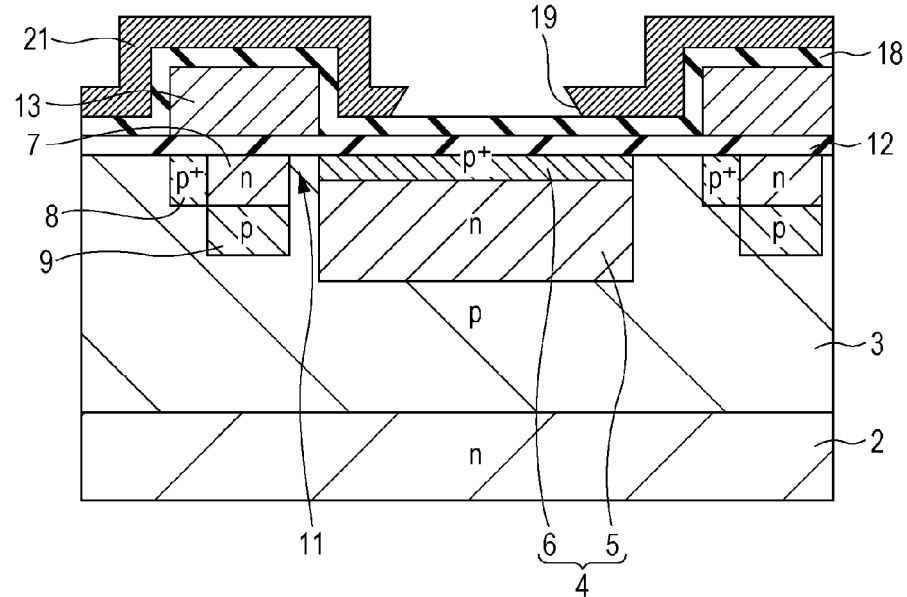
FIGS. 6D and 6E are representations of the manufacturing method of the solid-state imaging device according to the first embodiment.

Subsequently, a positive resist mask is formed on the material layer of the light-shielding film by lithography. The material layer is selectively etched through the resist mask so that the portion of the material layer overlying the photoelectric conversion portion 4 is removed to form a light-shielding film 21 acting as a light control film having a reverse tapered opening 19 in the region corresponding to the photoelectric conversion portion 4, as shown in FIG. 6D.

Figure 7A:
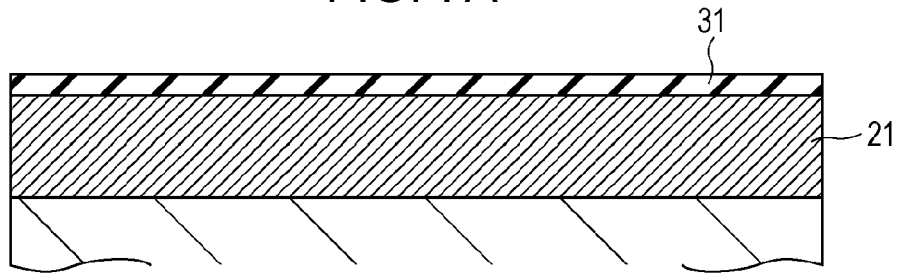
FIGS. 7A to 7C are representations of another manufacturing method of the solid-state imaging device according to the first embodiment.
Figure 7B:
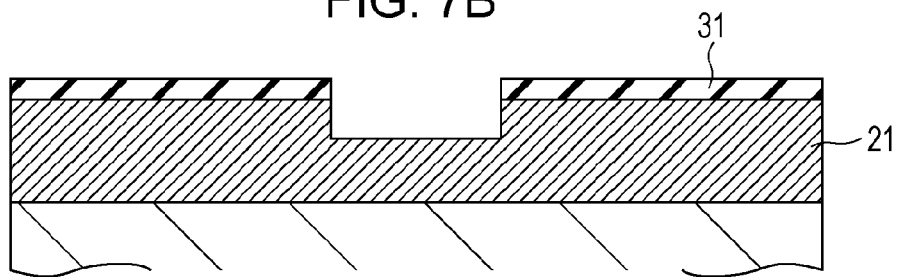
Figure 7C:
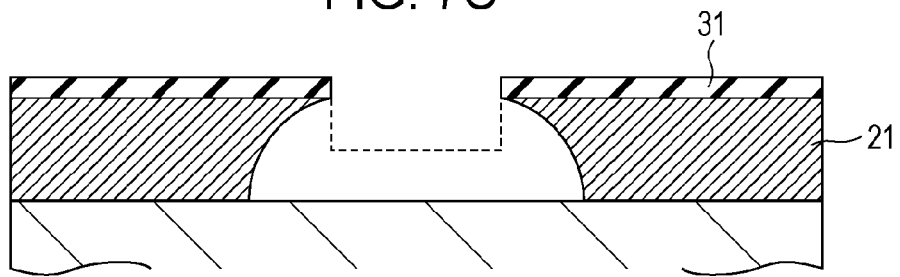

The reverse tapered opening 19 can be formed by, for example, an etching process as shown in FIGS. 7A to 7C. Specifically, after forming the material layer (first material layer) for the light-shielding film 21, another material layer or a second material layer 31 having a different etching property from the first material layer is formed on the first material layer, as shown in FIG. 7A. The second material layer 31 may be formed of silicon oxynitride.

Then, anisotropic dry etching is performed through a resist mask so that the entire thickness of the second material layer 31 and a depth of the first material layer 21A are selectively removed, as shown in FIG. 7B.

Subsequently, the rest of the depth of the first material layer is removed by selective isotropic etching through the resist mask, as shown in FIG. 7C. The isotropic etching may be performed by a dry process or a wet process. The reverse tapered opening 19 thus can be formed by selectively etching an additionally formed second material layer 31.

Figure 8:
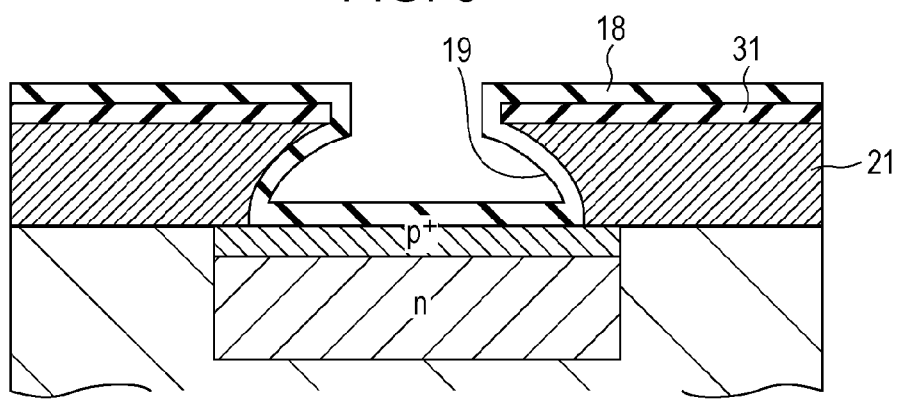
FIG. 8 is a representation of an alternative step forming an antireflection layer.

Although the antireflection layer 18 is formed before forming the light-shielding film 21 in an embodiment, as shown in FIG. 6D, it may be formed after forming the light-shielding film 21, as shown in FIG. 8.

Figure 6E:
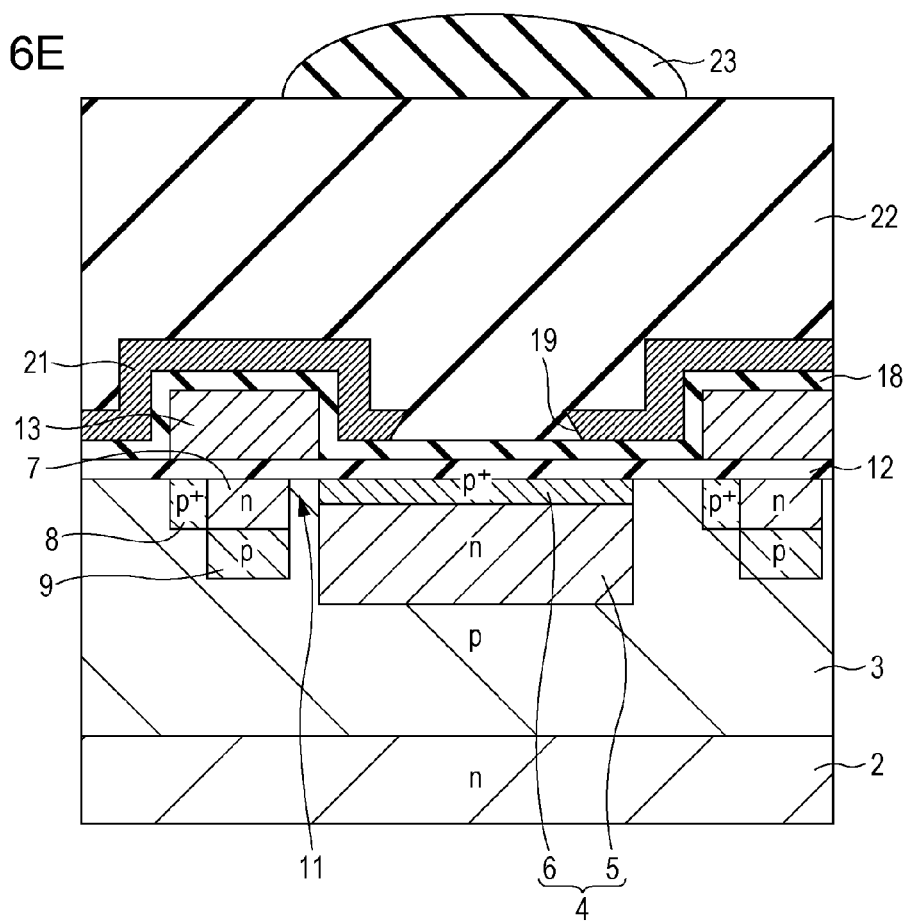

Subsequently, as shown in FIG. 6E, an insulating interlayer 22 is formed of, for example, BPSG (boron phosphosilicate glass) by CVD, followed by reflowing at about 800° C. In addition, an in-layer lens 23 is formed of, for example, silicon nitride on the insulating interlayer 22 by an existing technique. Then, a surface protective layer 24, a planarizing layer 25, a color filter 26 and an on-chip microlens 27 (each not shown) are formed in that order to complete a desired solid-state imaging device 1.

In the method for manufacturing a solid-state imaging device of the present embodiment, a light-shielding film 21 having a reverse tapered opening 19 can be formed. Since the opening can prevent diffracted light from entering the vertical register portion, the CCD image sensor 1 can reduce smears and exhibits enhanced sensitivity.

2. Second Embodiment

Structure of Solid-State Imaging Device

The solid-state imaging device according to a second embodiment is a CMOS image sensor. A CMOS image sensor typically includes an imaging region and a peripheral circuit region. The imaging region includes a plurality of pixels, each including a photoelectric conversion portion acting as a light-receiving portion. The unit pixel may include one photoelectric conversion portion and a plurality of pixel transistors (MOS transistors). Alternatively, a pixel-sharing structure may be applied in which a plurality of photoelectric conversion portions share pixel transistors other than the transfer transistor and the floating diffusion portion. The pixel transistors may include four transistors of a transfer transistor, a reset transistor, an amplification transistor and a selection transistor, or three transistors other than the selection transistor.

Figure 9:
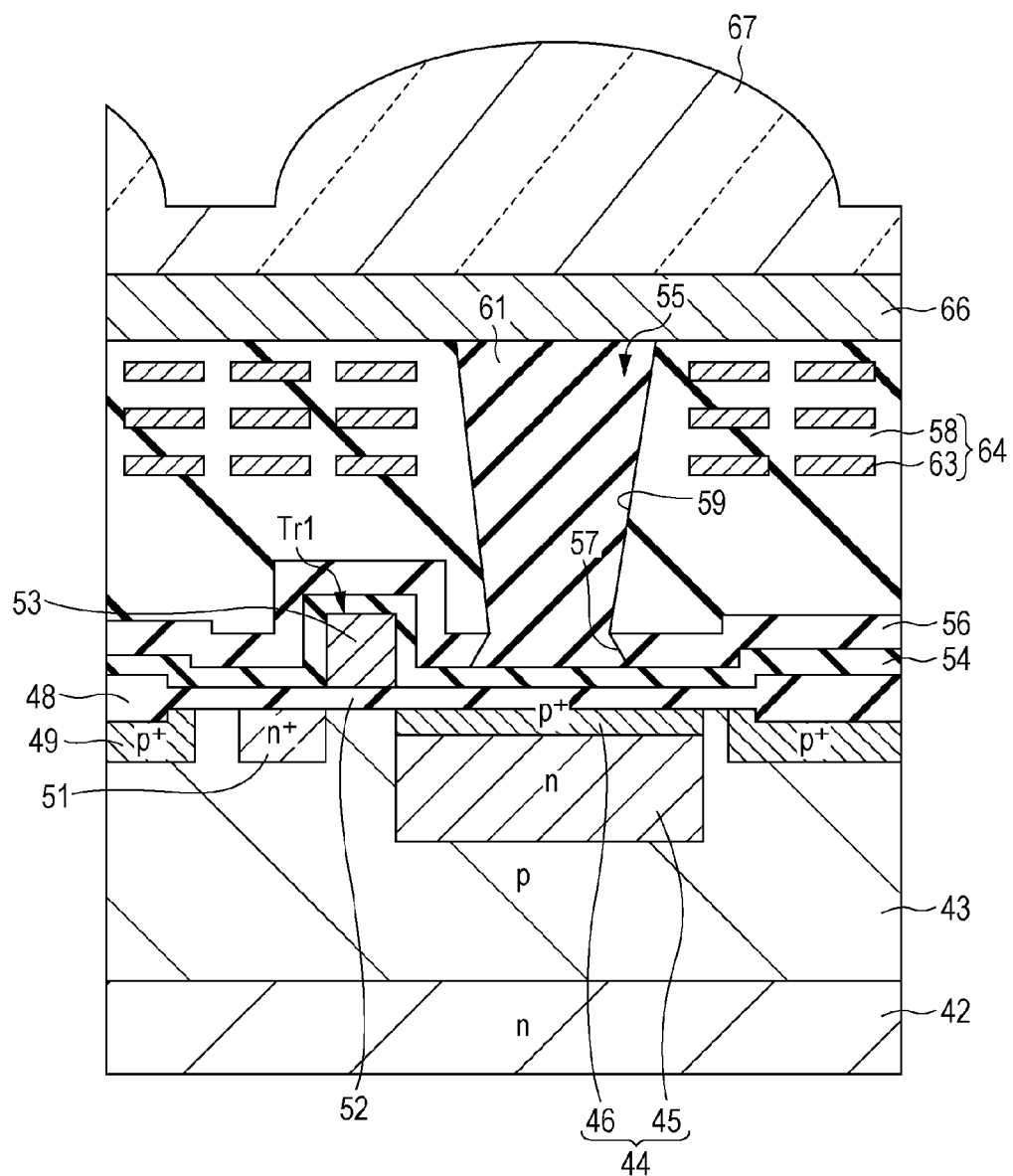
FIG. 9 is a schematic sectional view of a main portion of a solid-state imaging device according to a second embodiment of the invention.

FIG. 9 shows a solid-state imaging device according to the second embodiment of the invention, which is a CMOS image sensor. FIG. 9 is a schematic sectional view showing one of a plurality of pixels arranged in a two-dimensional array (in a matrix manner) in the imaging region.

The solid-state imaging device 41 of the second embodiment has pixels, each disposed in a semiconductor well region 43 formed in a first conductive silicon semiconductor substrate 42. The pixel includes a photoelectric conversion portion 44 acting as a light-receiving portion and a plurality of transistors. A plurality of unit pixels is regularly arranged in a two-dimensional array in, for example, a matrix manner to define an imaging region. In the present embodiment, the p-type semiconductor well region 43 is formed in an n-type semiconductor substrate 42, and the plurality of pixels is formed in the semiconductor well region 43 to define an imaging region.

The photoelectric conversion portion 44 includes an n-type semiconductor region 45 performing photoelectric conversion and storing charges, and a highly doped p-type semiconductor region 46 reducing the dark current at the surface of the n-type semiconductor region 45. The photoelectric conversion portion 44 is defined by a so-called photodiode. In the present embodiment, the pixel transistors include four transistors of a transfer transistor Tr1, a reset transistor, an amplification transistor, and a selection transistor (latter three not shown). The transfer transistor Tr1 is disposed close to the photoelectric conversion portion 44.

Element isolation regions 48 are formed on the p-type semiconductor well region 43 to separate the pixels from each other and divide the pixel. The element isolation region 48 may be defined by a shallow trench isolation (STI) structure, an oxide film formed by local oxidation of silicon (LOCOS oxide film), a structure in which an insulating film is formed on a highly doped p-type semiconductor region, or a highly doped p-type semiconductor region. In the present embodiment, the element isolation region 48 is made of a LOCOS oxide film. P-type semiconductor regions 49 more highly doped than the p-type semiconductor well region 43 are formed in the p-type semiconductor well region 43 so as to surround the element isolation regions 48.

The transfer transistor Tr1 includes the photoelectric conversion portion 44 as a source, the floating diffusion portion 51 of an n-type semiconductor region as a drain, and a transfer gate electrode 53 on a gate insulating film 52. The floating diffusion portion 51 is a region to which charges are transferred from the photoelectric conversion portion 44, and thus functions as a charge-receiving region.

Then, an optical waveguide 55 is provided over the photoelectric conversion portion 44, in the present embodiment. The optical waveguide 55 is formed on an antireflection layer 54 that is formed over the entire surface to cover the transfer gate electrode 53 and the gate electrodes of the other pixel transistors. Also, the optical waveguide 55 is formed in a multilayer wiring layer 64 including a plurality of layers of wirings 63 disposed in a second insulating interlayer 58 (described later). The wirings 63 are formed in the entire region of the insulating interlayer 58 except the region corresponding to the photoelectric conversion portion 44 and the optical waveguide 55. At the lower end of the optical waveguide 55, a first insulating interlayer 56 is formed as a first material layer of a light control film having a reverse tapered opening 57.

More specifically, the optical waveguide 55 is formed of an insulating material 61 filling the reverse tapered opening 57 in the first insulating interlayer 56 and a forward tapered opening 59 formed in the second insulating interlayer 58. The insulating material 61 has a higher refractive index than the second insulating interlayer 58 and the first insulating interlayer 56. The second insulating interlayer 58 corresponds to a second material layer. The opening 57 is formed in the first insulating interlayer 56 so that the lower end of the opening 57 has a smaller area than the photoelectric conversion portion 44.

In the optical waveguide 55, the interface between the second insulating interlayer 58 and the insulating material 61 filling the opening 59 acts as a total reflection surface at which light having entered the optical waveguide 55 is totally reflected. The reverse tapered shape of the opening 57 of the first insulating interlayer 56, that is, the shape of the lower end acting as a light control film of the optical waveguide 55 satisfies the requirements for reducing the intensity of diffracted light diffusing to regions other than the photoelectric conversion portion 44 and can be obtained from the above-described equation. The other structural properties of the first insulating interlayer having a reverse tapered opening are the same as those of the light-shielding film 21 described in the first embodiment, and the same description will be omitted.

A color filter 66 and an on-chip microlens 67 are formed on the second insulating interlayer 58 including the optical waveguide 55 with a surface protective layer and a planarizing layer (each not shown) therebetween.

In the solid-state imaging device 41 of the present embodiment, light enters the optical waveguide 55 from the upper side through the on-chip microlens 67. The diameter of the optical waveguide 55 decreases so as to become smallest at the level of the upper surface of the first insulating interlayer 56, and then increases up to the antireflection layer 54. The light having entered the optical waveguide 55 is guided to the photoelectric conversion portion 44 through the antireflection layer 54, and is subjected to photoelectric conversion there to generate charges (electrons in the present embodiment). The charges stored in the photoelectric conversion portion 44 are transferred to the floating diffusion portion 51 by applying a transfer gate pulse to the transfer gate electrode 53 of the transfer transistor, and is converted to a voltage there. The voltage is output as an output signal through the amplification transistor and the selection transistor.

In the CMOS image sensor 41 of the second embodiment, the opening 57 of the first insulating interlayer 56 at the lower end of the optical waveguide 55 has a reverse tapered shape. This shape prevents incoming light from diffusing to regions other than the photoelectric conversion portion 44. In other words, the intensity of diffracted light diffusing to regions other than the photoelectric conversion portion 44 can be reduced. Accordingly, the sensitivity of the CMOS image sensor can be enhanced. In addition, photo noises resulting from light diffracted to the floating diffusion portion 51 are reduced, so that noise relative to pixel signals can be reduced.

Method for Manufacturing Solid-State Imaging Device

Figure 10A:
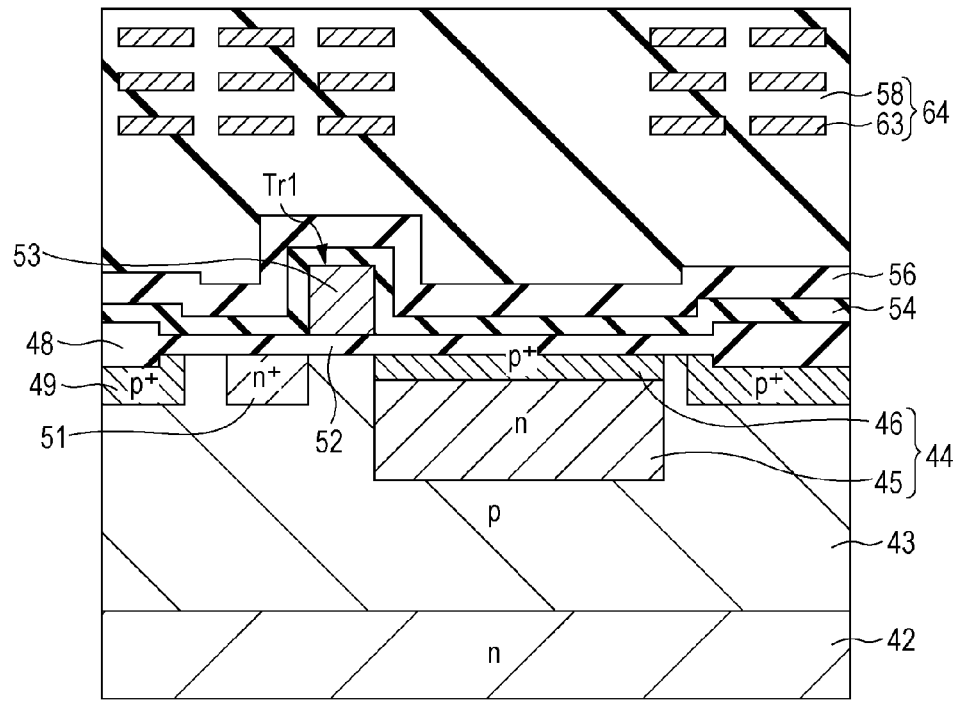
FIGS. 10A and 10B are representations of a manufacturing method of the solid-state imaging device according to the second embodiment.

FIGS. 10A to 11D show an exemplary method for manufacturing the solid-state imaging device 41, or a CMOS image sensor, according to the second embodiment. As shown in FIG. 10A, a p-type semiconductor well region 43 is formed in an n-type silicon semiconductor substrate 42. Element isolation regions 48 of, for example, a LOCOS oxide film and a photoelectric conversion portion 44 acting as a light-receiving portion are formed in the p-type semiconductor well region 43. P-type semiconductor regions 49 are formed to surround the element isolation regions 48. N-type semiconductor regions are formed for the floating diffusion portion 51 of the transfer transistor, and source and drain regions of other pixel transistors. Gate electrodes of the pixel transistors, including the transfer gate electrode 53, are formed on a gate insulating film 52 on the surface of the substrate, thus forming the pixel transistors including the transfer transistor Tr1.

Subsequently, an antireflection layer 54 is formed of, for example, silicon nitride over the entire surface so as to cove the transfer gate electrode 53 and other gate electrodes, and a first insulating interlayer 56 acting as a first material layer is formed on the antireflection layer 54. Furthermore, a multilayer wiring layer 64 is formed in which plurality of layers of wirings 63 are arranged in a second insulating interlayer 58 acting as a second material layer. Preferably, the first insulating interlayer 56 has a different etching property from the second insulating interlayer 58 and the antireflection layer 54 in the formation of the optical waveguide, that is, has a property that can ensure an etching selectivity.

For example, the first insulating interlayer 56 can be formed of boron phosphosilicate glass (BPSG), the second insulating interlayer 58 can be formed of an undoped plasma silicon oxide, and the antireflection layer 54 can be formed of silicon nitride (SiN) by a vacuum process. For the first material layer, a tungsten (W) layer, which is not insulating, may be used instead of the first insulating interlayer 56.

The thickness of the first insulating interlayer 56 or tungsten layer of the first material layer can be set according to the above-described equation. Preferably, the second insulating interlayer 58 is planarized by chemical mechanical polishing (CMP).

Figure 10B:
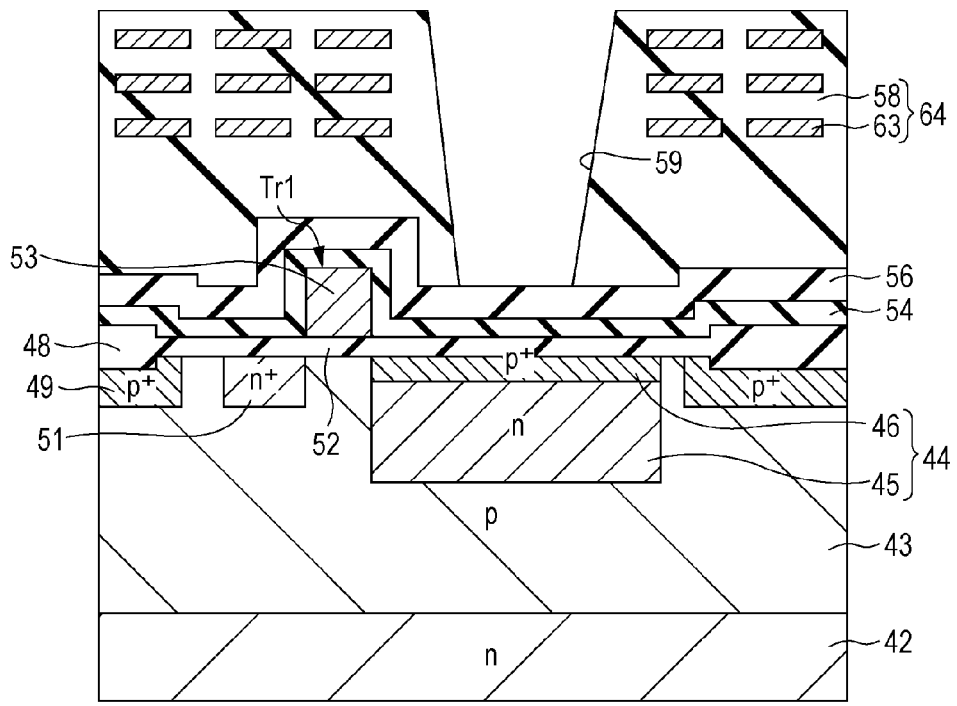

Then, a positive resist mask is formed on the second insulating interlayer 58 of the multilayer wiring layer 64 by lithography, and the second insulating interlayer 58 is selectively etched through the mask to form an opening 59 having a forward tapered section, as shown in FIG. 10B. This opening 59 is formed at a position corresponding to the photoelectric conversion portion 44.

Figure 11C:
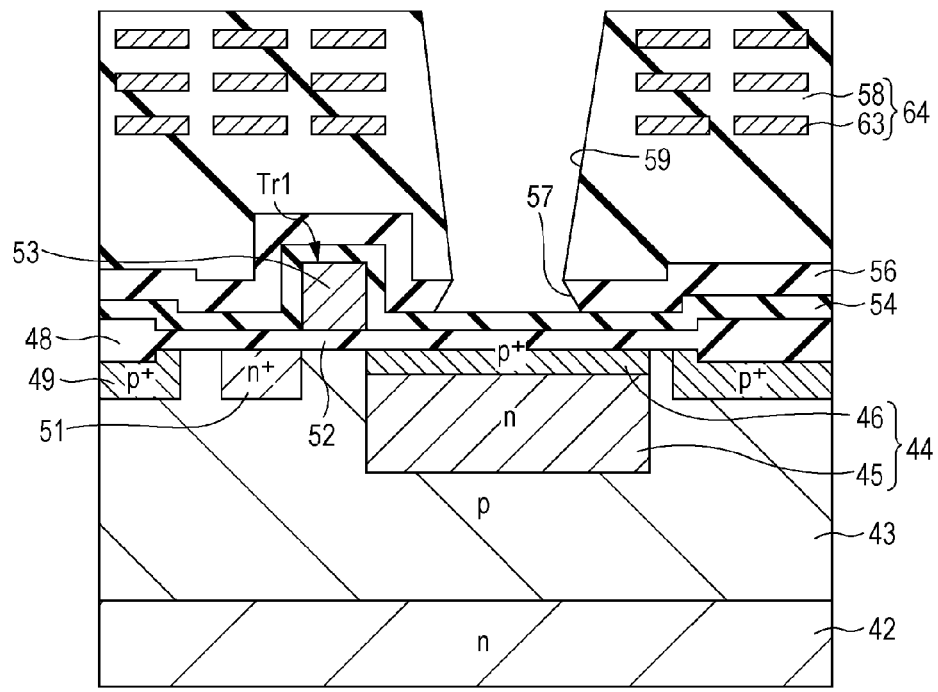
FIGS. 11C and 11D are representations of the manufacturing method of the solid-state imaging device according to the second embodiment.

Subsequent to the above operation, as shown in FIG. 11C, the first insulating interlayer 56 or the like of the first material layer is selectively etched to form an opening 57 having a reverse tapered section. The selective etching of the first insulating interlayer 56 is performed by isotropic etching as described above, so that the opening 57 can have a reverse tapered shape having a larger diameter at the interface between the first insulating interlayer 56 and the antireflection layer 54 than at the interface between the second insulating interlayer 58 and the first insulating interlayer 56. The isotropic etching may be performed by a dry process, or a wet process using a chemical solution. The first insulating interlayer 58 acts as a light control film.

The resist mask may be removed by ashing. The ashing may be performed after the selective etching of the second insulating interlayer 58 or after the selective etching of the first insulating interlayer 56.

Figure 11D:
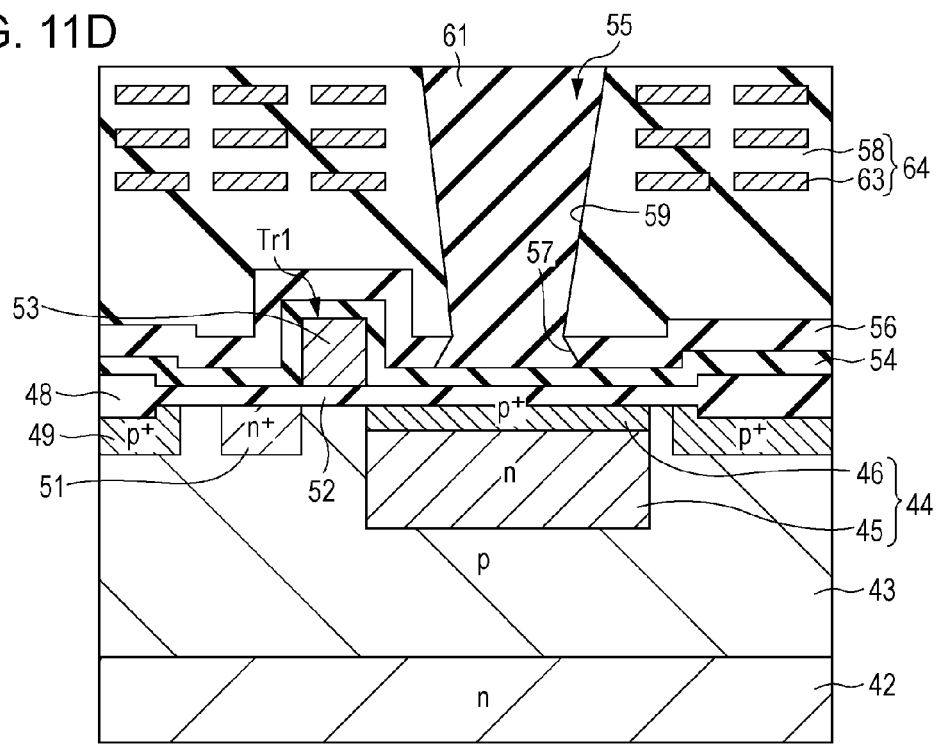

Then, as shown in FIG. 11D, the openings 57 and 59 are filled with a material 61 having a higher refractive index than the first insulating interlayer 56 and the second insulating interlayer 58 to form an optical waveguide 55 by, for example, chemical vapor deposition (CVD). The material 61 of the optical waveguide 55 may be deposited by combining atomic layer deposition (ALD) and CVD to prevent the occurrence of voids in the optical waveguide 55, which degrades the optical characteristics.

As an alternative to CVD or combination of ALD and CVD, the material 61 may be allowed to fill the openings 57 and 59 by applying an organic material and heat-treating the material to form a portion having a high refractive index, or by combining CVD, ALD and organic material application.

Subsequently, a surface protective layer, a planarizing layer (each not shown), a color filter 66, and an on-chip microlens 67 are formed in that order on the surface including the optical waveguide 55 and the multilayer wiring layer 64 by existing processes (not shown), and a desired CMOS image sensor 41 is thus completed.

In the method for manufacturing the solid-state imaging device of the present embodiment, a first insulating interlayer 56 having a reverse tapered opening 57, acting as a light control film can be formed at the lower end of the optical waveguide 55. Since the opening can prevent diffracted light from entering the floating diffusion portion 51, the CMOS image sensor 41 can reduce noises and exhibits enhanced sensitivity.

3. Third Embodiment

Structure of Solid-State Imaging Device

Figure 12:
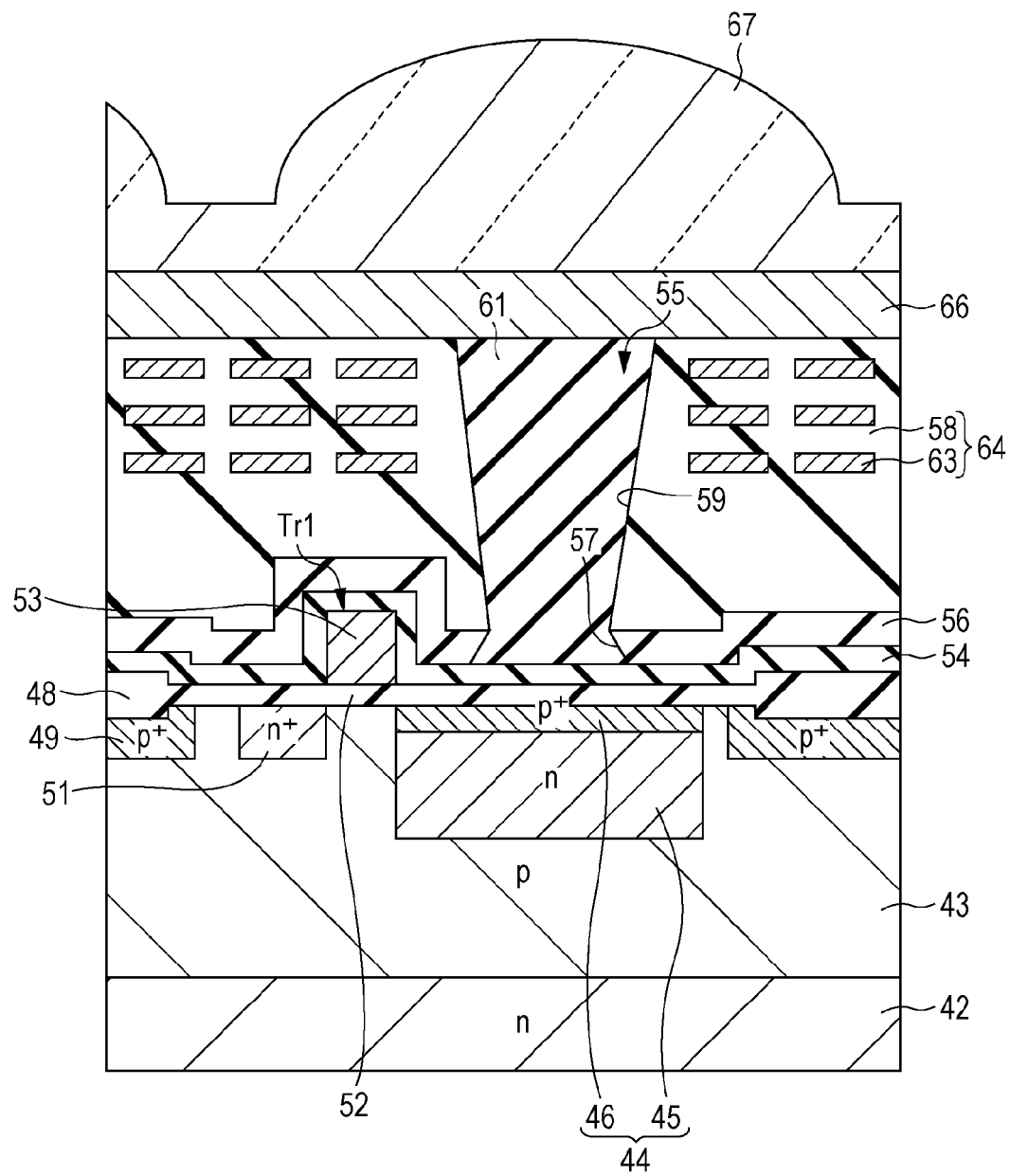
FIG. 12 is a schematic sectional view of a main portion of a solid-state imaging device according to a third embodiment of the invention.

FIG. 12 shows a solid-state imaging device according to a third embodiment of the invention, which is a CMOS image sensor. The CMOS image sensor of the present embodiment has a global shutter function. The solid-state imaging device 71 of the third embodiment has the same basic structure as the solid-state imaging device 41 of the second embodiment. In FIG. 12, portions corresponding to those shown in FIG. 9 are designated by the same reference numerals, and the same description will be omitted. The solid-state imaging device 71 of the third embodiment can be manufactured with reference to the method of the second embodiment shown in FIGS. 10A to 11D.

The solid-state imaging device 71 of the present embodiment is configured so that after evenly exposing all the pixels, signal charges from the photoelectric conversion portion 44 are transferred to the floating diffusion portion 51 simultaneously in all the pixels and is held in the floating diffusion portion 51 for a predetermined period. In the solid-state imaging device 71, the signal charges stored in the photoelectric conversion portions 44 of all the pixels are simultaneously transferred to the respective floating diffusion portions 51 and held there. Then, the signal charges are converted to voltages and output the voltages by the pixel line one after another. Hence, the floating diffusion portion 51 is configured as a holding portion having a memory function and corresponds to a charge-receiving region. In a solid-state imaging device having a global shutter function, the floating diffusion portion 51 holds charges for a long time, and accordingly, the device is considerably affected by noises caused by diffracted light entering the floating diffusion portion 51.

In the solid-state imaging device 71 of the third embodiment, since a first insulating interlayer 56 having a reverse tapered opening 57 at the lower end of the optical waveguide 55 is formed, light diffracted through the opening 57 can be prevented from diffusing to regions other than the photoelectric conversion portion 44. Accordingly, diffracted light is prevented from entering the floating diffusion portion 51, in which charges are held for a long period, and thus noise relative to pixel signals can be reduced effectively. In addition, since the diffusion of diffracted light to regions other than the photoelectric conversion portion 44 is prevented, the sensitivity can be increased.

4. Firth Embodiment

Structure of Solid-State Imaging Device

Figure 13:
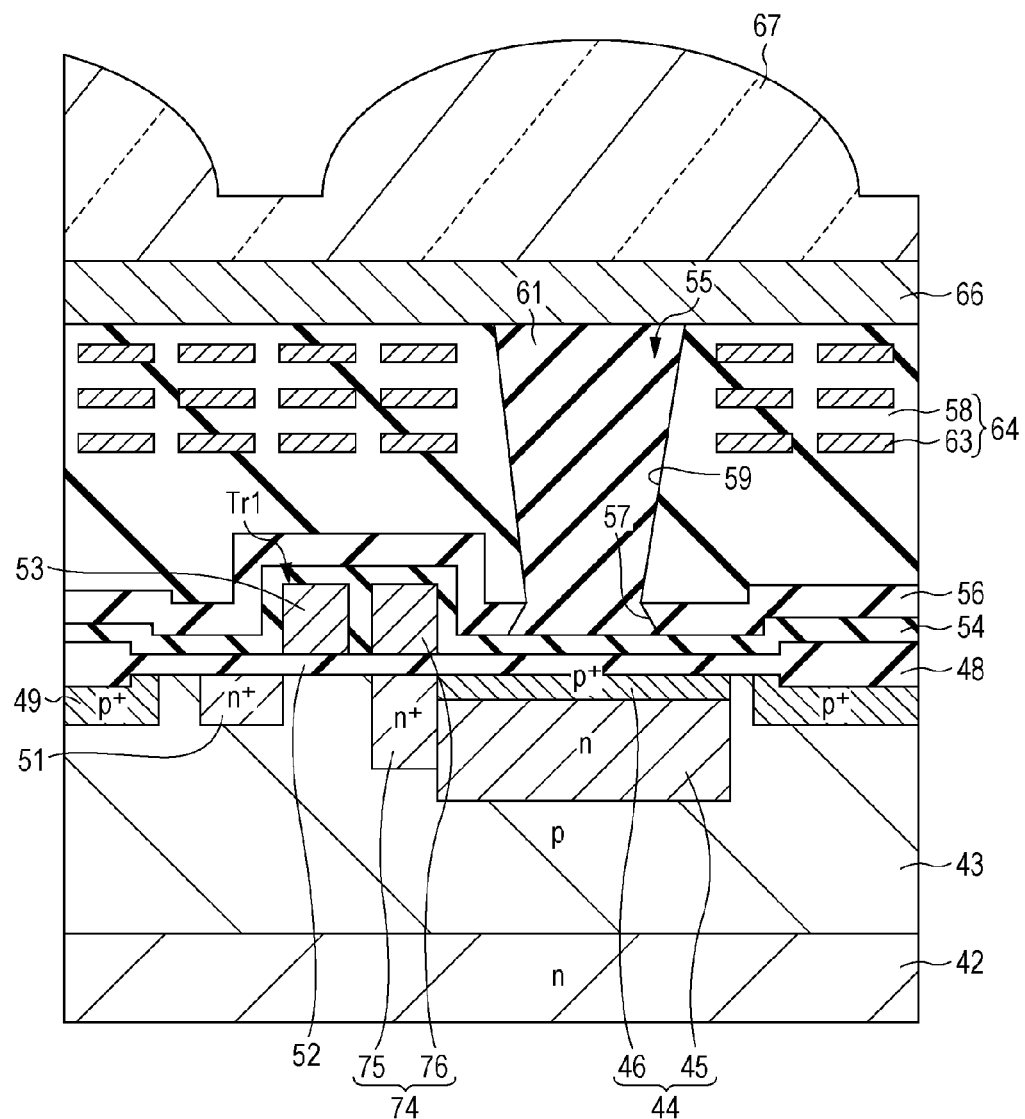
FIG. 13 is a schematic sectional view of a main portion of a solid-state imaging device according to a fourth embodiment of the invention.

FIG. 13 shows a solid-state imaging device according to a fourth embodiment of the invention, which is a CMOS image sensor. The CMOS image sensor of the present embodiment has a global shutter function. The solid-state imaging device 73 of the fourth embodiment includes a charge holding portion (so-called memory portion) 74 between the photoelectric conversion portion 44 and the floating diffusion portion 51 to hold temporarily signal charges of the photoelectric conversion portion 44. The charge holding portion 74 includes an n-type semiconductor region 75 adjacent to the photoelectric conversion portion 44 in the p-type semiconductor well region 43, and a gate electrode 76 on the n-type semiconductor region 75 with the gate insulating film 52 therebetween. The n-type semiconductor region 75 can be formed in the same process as the n-type semiconductor region for the floating diffusion portion 51.

The n-type semiconductor region 75 of the charge holding portion 74 holds signal charges transferred from the photoelectric conversion portion 44, and thus corresponds to a charge-receiving portion. An optical waveguide 55 is formed over the photoelectric conversion portion 44, and a first insulating interlayer 56 or first material layer having a reverse tapered opening 57 is formed as a light control film at the lower end of the optical waveguide 55.

Other components are the same as in the foregoing second and third embodiments. These parts in FIG. 13 are designated by the same reference numerals as in FIGS. 9 and 12, and the same description will be omitted. The solid-state imaging device 73 of the fourth embodiment can be manufactured with reference to the method of the second embodiment shown in FIGS. 10A to 11D.

In the solid-state imaging device 73 of the fourth embodiment, after exposing all the pixels for the same period, a read-out gate pulse is applied to the gate electrode 76 of the charge holding portion 74, and the signal charges of the photoelectric conversion portion 44 of each pixel are read out to and temporarily held in the n-type semiconductor region 75 of the charge holding portion 74. Then, a transfer gate pulse is applied to the transfer gate electrode 53, as usual, so that the signal charges held in the charge holding portions 74 are transferred to the floating diffusion portions 51 by the pixel line, and the selective transistor is turned on to read out the pixel signal.

In the solid-state imaging device 73 of the fourth embodiment, since a first insulating interlayer 56 having a reverse tapered opening 57 is formed at the lower end of the optical waveguide 55, light diffracted through the opening 57 can be prevented from diffusing to regions other than the photoelectric conversion portion 44. In the solid-state imaging device 73 having a global shutter function, diffracted light is prevented from entering the n-type semiconductor region 75 of the charge holding portion 74, in which charges are held for a long period, and thus noise relative to pixel signals can be reduced effectively. In addition, since the diffusion of diffracted light to regions other than the photoelectric conversion portion 44 is prevented, the sensitivity can be enhanced.

In the solid-state imaging devices of the second to fourth embodiments, an in-layer lens may be provided over the optical waveguide 55. The in-layer lens may be formed in the second insulating interlayer 58 of the multilayer wiring layer 64. By providing the in-layer lens, the light-collection efficiency can further be enhanced to increase the sensitivity.

5. Fifth Embodiment

Structure of Solid-State Imaging Device

Figure 14:
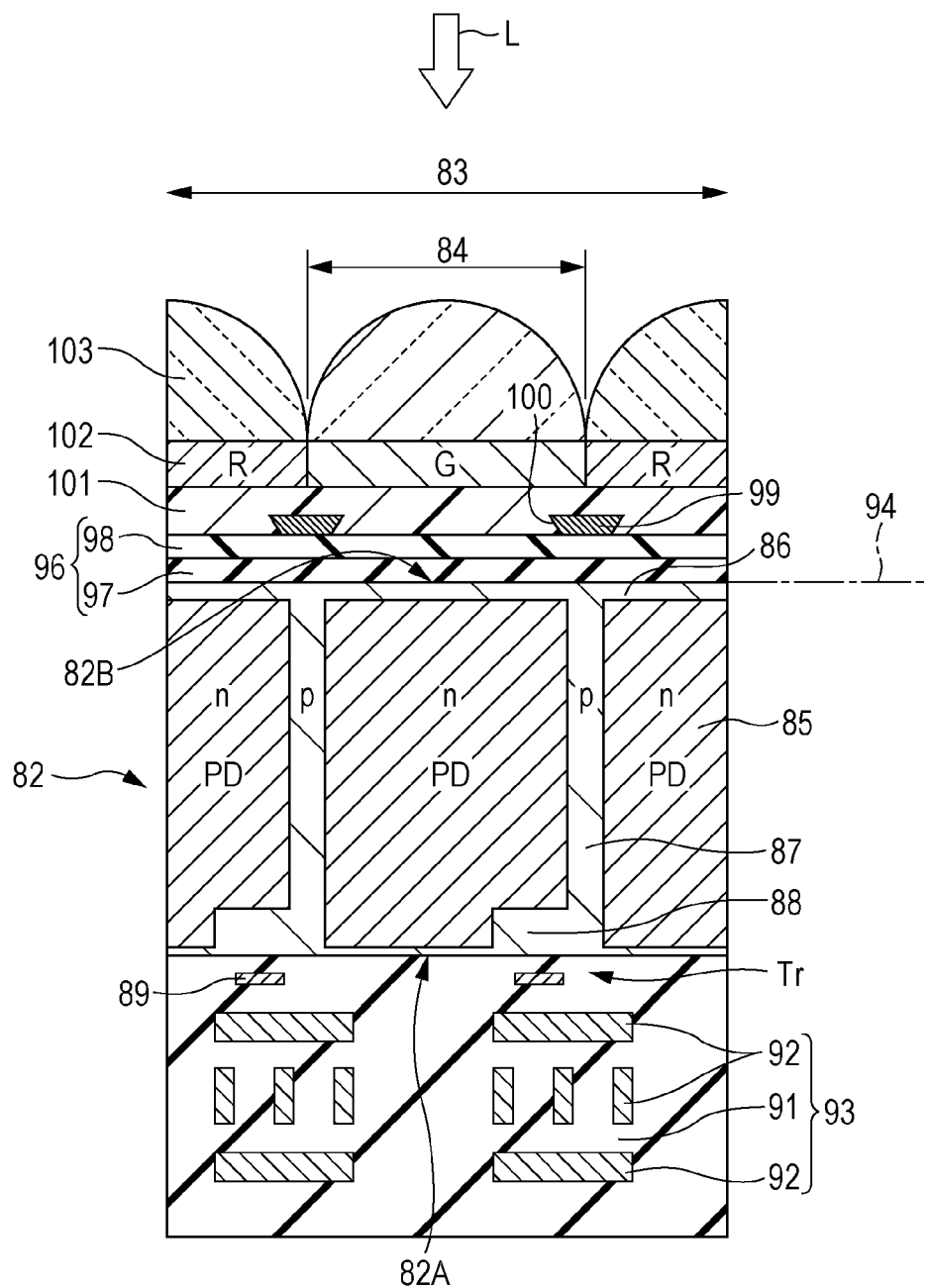
FIG. 14 is a schematic sectional view of a main portion of a solid-state imaging device according to a fifth embodiment of the invention.

FIG. 14 shows a solid-state imaging device according to the fifth embodiment of the invention, which is a CMOS image sensor. The CMOS image sensor of the present embodiment is of back-illuminated type. FIG. 14 shows parts in a portion corresponding to an equivalent of two pixels of the back-illuminated CMOS image sensor.

The solid-state imaging device 81 of the fifth embodiment includes an imaging region 83 in which a plurality of pixels are arranged in and on a silicon semiconductor substrate 82, a peripheral circuit region (not shown) disposed around the imaging region 83. A unit pixel 84 includes a photoelectric conversion portion (hereinafter referred to as photodiode) PD acting as a light-receiving portion, and a plurality of pixel transistors Tr. The photodiode PD is formed across the thickness of the semiconductor substrate 82 and is of pn junction type including a first conductive semiconductor region 85 (n-type in the present embodiment) and a second conductive semiconductor region 86 (p type in the present embodiment) extending from the face to rear side of the substrate. The p-type semiconductor region 86 extending to both surfaces of the substrate doubles as a hole charge storage region for controlling dark current.

Pixels 84 each including the photodiode PD and the pixel transistors Tr are separated from each other by element isolation regions 87. Each element isolation region 87 is formed of the p-type semiconductor region and grounded. Each pixel transistor Tr includes n-type source and drain regions (not shown) in a p-type semiconductor well region 88 formed close to the surface 82A of the semiconductor substrate 82, and a gate electrode 89 between the source and drain regions on the surface of the substrate with a gate insulating film therebetween. FIG. 14 shows one of the pixel transistors as a representative and the pixel transistor Tr is schematically shown by a gate electrode 89. The pixel transistor Tr shown in the figure is a transfer transistor having a floating diffusion portion.

On the surface 82A of the semiconductor substrate 82, a multilayer wiring layer 93 including a plurality of wirings 92 arranged in an insulating interlayer 91 is formed. Since light L does not enter the multilayer wiring layer 93, the layout of the wirings 92 can be arbitrarily designed.

An insulating layer is formed on the rear surface 82B of the substrate 82, which is a light-receiving surface 94 of the photodiode PD. In the present embodiment, the insulating layer is an antireflection layer 96. The antireflection layer 96 includes a plurality of layers having different refractive indices, and, in the present embodiment, includes two layers of a film 98 having a negative fixed charge and a silicon oxide film 97. The film 98 having a negative fixed charge may be made of, for example, hafnium oxide ($HfO_2$), aluminium oxide ($Al_2O_3$), zirconium oxide ($ZrO_2$), tantalum oxide ($Ta_2O_5$), or titanium oxide ($TiO_2$). Films of these materials have been used in practice as the gate insulating film of insulated gate electric field effect transistors, and can be easily formed by an established method. Exemplary methods include chemical vapor deposition, sputtering, and atomic layer deposition. Preferably, atomic layer deposition is applied because a $SiO_2$ layer capable of reducing the interface state can be simultaneously formed to a thickness of about 1 nm during the formation of the insulating film. In addition, other materials can be used including lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), and yttrium oxide ($Y_2O_3$). Also, the film 98 having a negative fixed charge may be made of hafnium nitride, aluminium nitride, hafnium oxynitride, or aluminium oxynitride.

On the antireflection layer 96, a light-shielding film 99 having reverse tapered openings 100 is formed corresponding to the boundaries of the pixels. The reverse tapered shape of the opening 100 of the light-shielding film 99 has conditions at which the intensity of diffracted light diffusing to regions other than the photodiode PD can be reduced, and can be determined from the above-described equation. The other structural properties of the light-shielding film 99 having the reverse tapered openings 100 are the same as those of the light-shielding film 21 described in the first embodiment, and the same description will be omitted.

The light-shielding film 99 can be made of any light-shielding material, and is preferably made of a metal such as aluminum (Al), tungsten (W), or copper (Cu). These metals have high light-shielding properties and can be precisely worked by, for example, etching.

A planarizing layer 101 is formed over the antireflection layer 96 and the light-shielding film 99, and on-chip color filters 102 and on-chip microlenses 103 are formed in that order on the planarizing layer 101. The on-chip microlenses 103 are made of an organic material, such as a resin. The planarizing layer 101 is also made of an organic material, such as a resin. The on-chip color filters 102 may be arranged in a Beyer array. Light L, which enters through the rear surface 82B of the substrate 82, is collected through the on-chip microlenses 103 and received by each photodiode PD.

In the solid-state imaging device 81 of the fifth embodiment, a light-shielding film 99 is provided very close to the light-receiving surface 94 corresponding to the boundaries of the pixels, so that light not collected through the on-chip microlenses 103 can be blocked from the adjacent pixels. Thus, the light-shielding film 99 at the boundaries of the pixels prevents light from entering the adjacent pixels, thereby reducing optical color mixing. Furthermore, since the reverse tapered openings 100 of the light-shielding film 99 satisfy the requirements obtained from the above equation, light diffracted through the opening 100 can be prevented from diffusing to regions other than the photodiode PD. Thus, optical color mixing can be further reduced in the solid-state imaging device including miniaturized pixels at a high density. Also, since the diffusion of diffracted light to regions other than the photoelectric conversion portion or photodiode PD is prevented, the sensitivity can be enhanced.

6. Sixth Embodiment

Structure of Solid-State Imaging Device

A solid-state imaging device according to a sixth embodiment of the invention will now be described. In the foregoing first to fifth embodiments, the openings in the light control film have the same reverse tapered shape for each of the red, green and blue pixels, that is, a shape corresponding to wavelengths of red light. In the solid-state imaging device of the sixth embodiment, on the other hand, the reverse tapered openings in the light control film have different revere taper angles according to the respective color components separated through color filters.

More specifically, in the solid-state imaging device of sixth embodiment, the openings of the light control film have different reverse taper angles according to the wavelengths of the respective colors of the red, green and blue pixels. When the light control film has a uniform thickness, the respective reverse taper angles θR, θG and θB for red light, green light and blue light have the relationship θR>θG>θB.

In the solid-state imaging device of the sixth embodiment, the red, green and blue pixels have openings having different reverse tapered shapes in the light control film. The reverse tapered shapes are determined from the above equation, corresponding to the respective wavelengths of red, green and blue light. Consequently, the intensity of diffracted light of each color diffusing to regions other than the corresponding photoelectric conversion portion can be reduced. Hence, the intensity of light can be optimized according to the wavelengths of red, green and blue light. Consequently, not only the sensitivity can be enhanced, but also smears, noises and optical color mixing can be reduced, in the solid-state imaging device including miniaturized pixels at a high density.

Each unit pixel of the CMOS image sensor may include unshared unit pixels, each including one photodiode and a plurality of pixel transistors, for example, three or four transistors. Alternatively, it may be of shared pixel type in which a plurality of photoelectric conversion portions shares one floating diffusion portion and one pixel transistor.

Although the solid-state imaging devices according to the above-described embodiments use electrons as the signal charges, and the first conductive type refers to the n type and the second conductive type refers to the p type, the invention can be applied to a solid-state imaging device using holes as the signal charges. In this instance, the n type is the second conductive type and the p type is the first conductive type.

7. Seventh Embodiment

Structure of Electronic Appratus

The solid-state imaging devices according to the above embodiments can be applied to electronic apparatuses, for example, camera systems such as digital cameras and video cameras, and cellular phones and other apparatuses having imaging functions.

Figure 15:
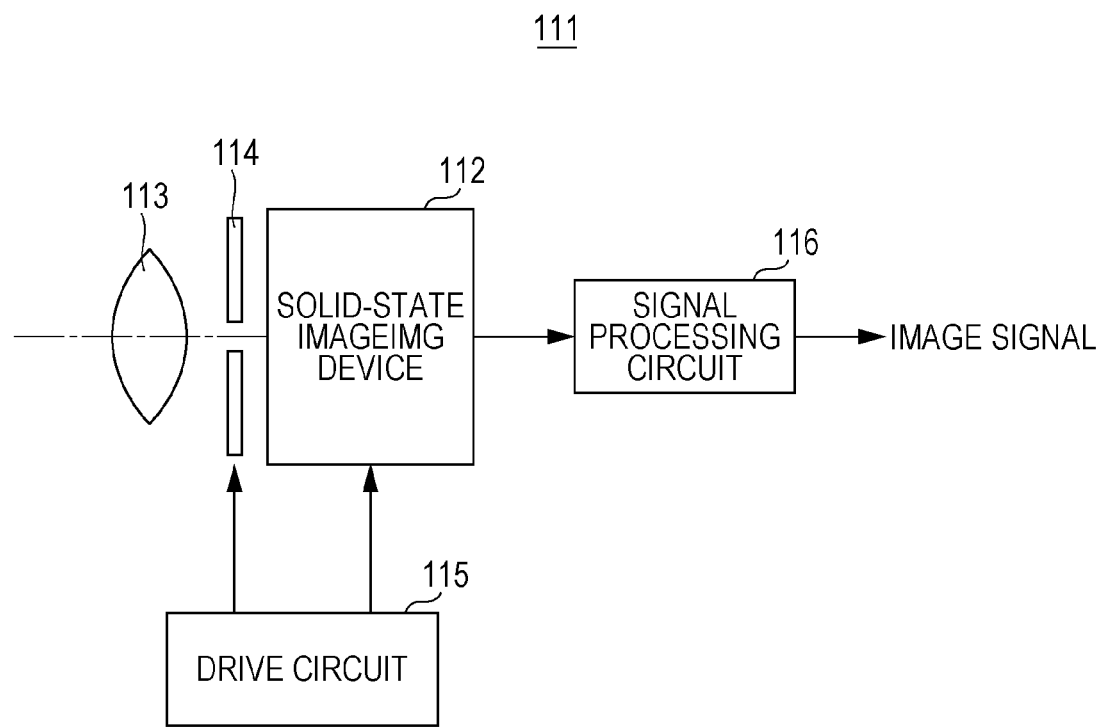
FIG. 15 is a schematic block diagram of an electronic apparatus according to a sixth embodiment of the invention.

FIG. 15 shows a camera of a seventh embodiment as an example of the electronic apparatus of the invention. The camera of the present embodiment is a video camera capable of taking still pictures and moving images. The camera 111 of the present embodiment includes a solid-state imaging device 112, an optical system 113 that guides light entering the photoelectric conversion portion of the solid-state imaging device 112, and a shutter device 114. The camera 111 further includes a drive circuit 115 that operates the solid-state imaging device 112, and a signal processing circuit 116 that processes signals output from the solid-state imaging device 112.

Any one of the above-described solid-state imaging devices may be used as the solid-state imaging device 111 of the present embodiment. The optical system (optical lens) 113 focuses image light (incoming light) from an object on an image pickup face of the solid-state imaging device 112. Consequently, signal charges are stored in the solid-state imaging device 112 for a certain period. The optical system 113 may include a plurality of optical lenses. The shutter device 114 controls the time for which the solid-state imaging device 112 is irradiated with light and the time for which it is shield from light. The drive circuit 115 supplies signals for controlling the transfer operation of the solid-state imaging device 112 and the shuttering operation of the shutter device 114. The solid-state imaging device 112 transfers a signal according to the driving signal (timing signal) supplied from the drive circuit 115. The signal processing circuit 116 processes various signals. A processed image signal is stored in a storage medium, such as a memory device, or is outputted to a monitor.

In an electronic apparatus such as the camera of the seventh embodiment, the solid-state imaging device 112 includes a light control film having reverse tapered openings over the photoelectric conversion portions. The opening can prevent diffracted light from entering a charge-receiving portion adjacent to the photoelectric conversion portion. Consequently, noises such as smears and color mixing can be reduced and the sensitivity can be enhanced. Accordingly, the electronic apparatus can provide high-quality images and exhibit high performance.

8. Eighth Embodiment

Structure of Camera Module

A camera module of an eighth embodiment of the invention may include the optical system 112, the solid-state imaging device 113 and the signal processing circuit 114, each shown in FIG. 15. The camera module may include a lens tube including a lens system. The camera module can be used as a component of electronic apparatuses, for example, camera systems such as digital cameras and video cameras, and cellular phones and other electronic apparatuses having imaging functions.

In the camera module of the eighth embodiment, smears and color mixing in the solid-state imaging device can be prevented, and the sensitivity can be enhanced. Accordingly, the use of the camera module can achieve a high-performance electronic apparatus providing high-quality images.

The present application contains subject matter related to that disclosed in Japanese Priority Patent Application JP 2010-086162 filed in the Japan Patent Office on Apr. 2, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a photoelectric conversion portion with a plurality of pixels with respective color components separated by color filters;
   a charge-receiving portion to which charges are transferred from the photoelectric conversion portion; and
   a light control film having reverse tapered openings over the photoelectric conversion portion, thereby reducing the intensity of diffracted light diffusing to regions other than the photoelectric conversion portion,
   wherein,
      a respective reverse tapered opening is provided for each pixel, and
      the reverse tapered openings have different reverse taper angles according to the respective color components.

2. The solid-state imaging device according to claim 1, wherein the light control film includes a light-shielding film.

3. The solid-state imaging device according to claim 1, further comprising an optical waveguide over the photoelectric conversion portion, wherein the light control film is disposed at a lower end of the optical waveguide.

4. The solid-state imaging device according to claim 1, wherein the reverse tapered opening has a shape having a plurality of steps.

5. The solid-state imaging device according to claim 1, wherein the lower end of the reverse tapered opening has a smaller area than the photoelectric conversion portion.

6. An electronic apparatus comprising:
   the solid-state imaging device as set forth in claim 1;
   an optical system that guides incoming light to the photoelectric conversion portion of the solid-state imaging device; and
   a signal processing circuit that processes a signal output from the solid-state imaging device.

7. A camera module comprising:
   the solid-state imaging device as set forth in claim 1;
   an optical system that guides incoming light to the photoelectric conversion portion of the solid-state imaging device; and
   a signal processing circuit that processes a signal output from the solid-state imaging device.

8. A solid-state imaging device comprising:
   a photoelectric conversion portion that generates a charge according to light incident thereon, the photoelectric conversion portion having a plurality of pixels with respective color components separated by color filters; and
   a light-shielding film having a plurality of openings over the photoelectric conversion portion, each opening having a smaller area at one side of the light-shielding film through which light enters than at the other side,
   wherein,
      a respective reverse tapered opening is provided for each pixel, and
      the reverse tapered openings have different reverse taper angles according to the respective color components.

* * * * *